United States Patent
Tani et al.

(10) Patent No.: US 9,917,234 B2
(45) Date of Patent: Mar. 13, 2018

(54) METHOD OF MANUFACTURING LIGHT EMITTING DEVICE

(71) Applicant: NICHIA CORPORATION, Anan-shi, Tokushima (JP)

(72) Inventors: Takahiro Tani, Tokushima (JP); Hiroki Yuu, Anan (JP); Toshiaki Moriwaki, Tokushima (JP)

(73) Assignee: Nichia Corporation, Anan-shi (JP)

( * ) Notice: Subject to any disclaimer, the term of this patent is extended or adjusted under 35 U.S.C. 154(b) by 12 days.

(21) Appl. No.: 15/218,323

(22) Filed: Jul. 25, 2016

(65) Prior Publication Data

US 2017/0040512 A1 Feb. 9, 2017

(30) Foreign Application Priority Data

Aug. 4, 2015 (JP) ................................. 2015-154002

(51) Int. Cl.
*H01L 33/58* (2010.01)
*H01L 33/62* (2010.01)
(Continued)

(52) U.S. Cl.
CPC .............. *H01L 33/58* (2013.01); *H01L 33/62* (2013.01); *H01L 2933/0033* (2013.01);
(Continued)

(58) Field of Classification Search
CPC . H01L 33/58; H01L 33/62; H01L 2933/0033; H01L 2933/0058; H01L 2933/0066; H01S 5/005; H01S 5/0425
(Continued)

(56) References Cited

U.S. PATENT DOCUMENTS

2009/0086478 A1* 4/2009 Sanroma .................. A47F 3/001
362/234
2011/0284822 A1* 11/2011 Jung ...................... H01L 33/505
257/13
(Continued)

FOREIGN PATENT DOCUMENTS

JP 2012-146898 A 8/2012
JP 2014-225644 A 12/2014
(Continued)

*Primary Examiner* — Moin Rahman
(74) *Attorney, Agent, or Firm* — Global IP Counselors, LLP (57) ABSTRACT

A method of manufacturing a light emitting device includes: arranging a first light emitting element and a second light emitting element, each having a pair of first and second electrodes disposed on a surface opposite to a main light emitting surface, on a base body adjacent to each other with the pair of electrodes facing upward; forming a pair of electrically conductive members each extending between one of the pair of electrodes of the first light emitting element and a corresponding one of the pair of electrodes of the second light emitting element; forming a light shielding member at least covering between the first and second light emitting elements; and cutting the pair of electrically conductive members and the light shielding member between the first and second light emitting elements, along a direction substantially perpendicular to the main light emitting surface of each of the first and second light emitting elements.

14 Claims, 6 Drawing Sheets (51) Int. Cl.
  *H01S 5/042* (2006.01)
  *H01S 5/00* (2006.01)
(52) U.S. Cl.
  CPC ............ *H01L 2933/0058* (2013.01); *H01L 2933/0066* (2013.01); *H01S 5/005* (2013.01); *H01S 5/0425* (2013.01)
(58) Field of Classification Search
  USPC ..... 257/13, 79–103, 918, 40, 642–643, 759; 438/22–47, 69, 493, 503, 507, 956
  See application file for complete search history.

(56) References Cited

U.S. PATENT DOCUMENTS

| | | | |
|---|---|---|---|
| 2014/0042470 A1* | 2/2014 | Hsu | H01L 33/505 257/98 |
| 2014/0319567 A1 | 10/2014 | Yoneda et al. | |
| 2015/0207042 A1 | 7/2015 | Yoneda et al. | |
| 2015/0311410 A1 | 10/2015 | Yoneda et al. | |
| 2015/0364663 A1* | 12/2015 | Morimura | H01L 33/62 257/88 |

FOREIGN PATENT DOCUMENTS

| | | |
|---|---|---|
| JP | 2015-008220 A | 1/2015 |
| JP | 2015-135904 A | 7/2015 |
| JP | 2015-165534 A | 9/2015 |
| WO | 2012-095903 A1 | 7/2012 |

\* cited by examiner

METHOD OF MANUFACTURING LIGHT EMITTING DEVICE

CROSS-REFERENCE TO RELATED PATENT APPLICATIONS

The present application claims the benefit of Japanese Patent Application No. 2015-154002, filed on Aug. 4, 2015. The entire disclosure of Japanese Patent Application No. 2015-154002 is incorporated by reference herein.

BACKGROUND

1. Technical Field

The present disclosure relates to a method of manufacturing a light emitting device.

2. Description of Related Art

Light emitting devices provided with light emitting elements have been widely used for light sources for backlight of liquid crystal display televisions and luminaires, or the like. Various light emitting devices having various types of packages according to the forms of usage, in particular small-sized and thin type side-view-type light emitting devices have been proposed (for example, JP 2015-8820 A and JP 2012-146898 A). Consequently, establishing a method to manufacture such small-sized and thin type light emitting devices that can be firmly fixed to mounting substrates with ease or high accuracy has been required.

SUMMARY

Various embodiments described herein are directed to methods of manufacturing small-sized side-view-type light emitting devices with ease or high accuracy.

A method of manufacturing a light emitting device according to one aspect includes: arranging a first light emitting element and a second light emitting element, each having a pair of first and second electrodes disposed on a surface opposite to a main light emitting surface, on a base body adjacent to each other with the pair of electrodes facing upward; forming a pair of electrically conductive members each extending between one of the pair of electrodes of the first light emitting element and a corresponding one of the pair of electrodes of the second light emitting element; forming a light shielding member at least covering between the first and second light emitting elements; and cutting the pair of electrically conductive members and the light shielding member between the first and second light emitting elements, along a direction substantially perpendicular to the main light emitting surface of each of the first and second light emitting elements.

Small-sized side-view-type light emitting devices can be manufactured with ease or with high accuracy according to various embodiments described herein.

DETAILED DESCRIPTION

Certain embodiments according to the present invention will be described below with reference to the accompanying drawings. However, the embodiments discussed below are to exemplify light emitting devices for embodying the technical idea of the present invention, and the technical idea of the present invention is not limited to the following. In particular, dimensions, materials, shapes, and relative positional relationships of components are given illustrative and not to limit the technical scope of the present disclose and hence may be exaggerated for ease of explanation. In the embodiments described below, the components can also be combined in other embodiments.

First Embodiment

Figure 1A:
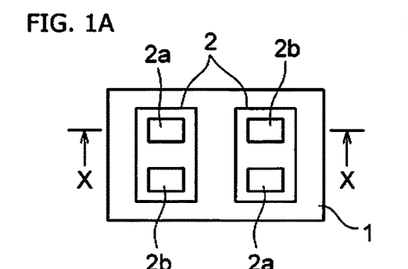
FIG. 1A is a schematic plan view illustrating a step of arranging light emitting elements on a base body according to a method of manufacturing a light emitting device according to a first embodiment.
Figure 1B:
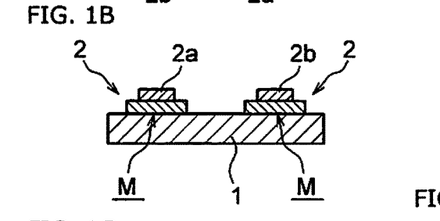
FIG. 1B is a schematic cross sectional view taken along line X-X' of FIG. 1A.
Figure 1C:
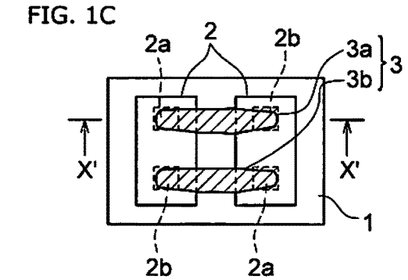
FIG. 1C is a schematic plan view illustrating a step of forming an electrically conductive member according to the first embodiment.
Figure 1D:
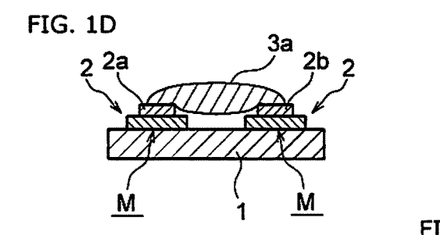
FIG. 1D is a schematic cross-sectional view taken along line X-X' of FIG. 1C.
Figure 1E:
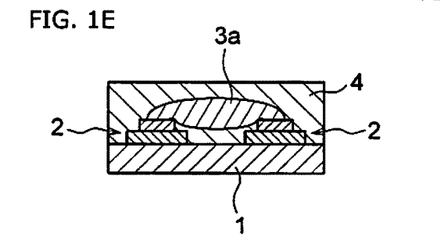
FIG. 1E and FIG. 1F are schematic cross-sectional views illustrating a step of forming a light shielding member according to the first embodiment.
Figure 1F:
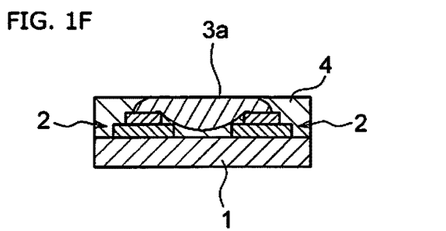
Figure 1G:
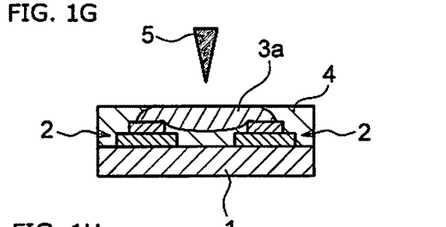
FIG. 1G and FIG. 1H are schematic cross-sectional views illustrating a step of cutting the electrically conductive member according to the first embodiment.
Figure 1H:
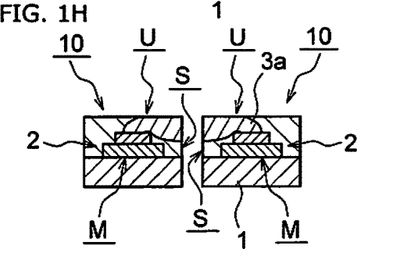
Figure 1I:
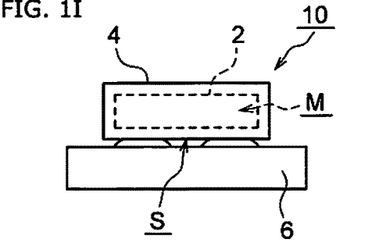
FIG. 1I is a schematic front view of a light emitting module seen from its light emitting surface side, in which a light emitting device according to the first embodiment is mounted on a mounting substrate.
Figure 1J:
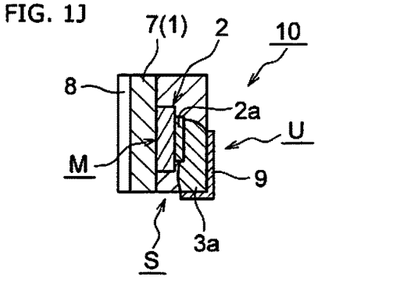
FIG. 1J is a schematic cross-sectional view of a light emitting device according to the first embodiment.

FIG. 1A is a schematic plan view illustrating a step of arranging light emitting elements on a base body according to a method of manufacturing a light emitting device according to a first embodiment. FIG. 1B is a schematic cross sectional view taken along line X-X' of FIG. 1A. FIG. 1C is a schematic plan view illustrating a step of forming an electrically conductive member according to the first embodiment. FIG. 1D is a schematic cross-sectional view taken along line X-X' of FIG. 1C. FIG. 1E and FIG. 1F are schematic cross-sectional views illustrating a step of forming a light shielding member according to the first embodiment. FIG. 1G and FIG. 1H are schematic cross-sectional views illustrating a step of cutting the electrically conductive member according to the first embodiment. FIG. 1I is a schematic front view of a light emitting module seen from its light emitting surface side, in which a light emitting device according to the first embodiment is mounted on a mounting substrate. FIG. 1J is a schematic cross-sectional view of a light emitting device according to the first embodiment. In the first embodiment, each light emitting device 10 can be formed through at least the steps described below. As shown in FIG. 1A and FIG. 1B, two light emitting elements 2 (hereinafter may be referred to as a first light emitting element 2 and a second light emitting element 2) each has a main light emitting surface M and a surface having a pair of electrodes 2a, 2b and opposite to the main light emitting surface M. The two light emitting elements 2 are arranged adjacent to each other on a base body 1, with the pair of electrodes 2a, 2b facing upward. Then, as shown in FIG. 1C and FIG. 1D, a pair of electrically conductive members 3 (3a, 3b) is formed such that a portion of each of the pair of electrically conductive members is disposed on each of the electrodes 2a, 2b of the first light emitting element 2 and is extended onto a portion of each of the corresponding electrodes 2a, 2b of the second light emitting element 2. In other words, a pair of electrically conductive members 3 (3a, 3b) that bridge corresponding electrodes of the first light emitting element 2 and the second light emitting element 2 are formed. Then, as shown in FIG. 1E and FIG. 1F, a light shielding member 4 that covers at least between the two light emitting elements 2 is formed. Then, as shown in FIG. 1G and FIG. 1H, at least the pair of electrically conductive members 3a, 3b and the light shielding member 4 between the light emitting elements 2 are cut in a direction substantially perpendicular to the main light emitting surfaces M. In the first embodiment, the cut surface can be used as a mounting surface S of the light emitting device 10. Further, the light shielding member 4 may be appropriately cut along one or more lateral surfaces of the light emitting element 2. Thus, the light emitting devices 10 of side-view type each having, as shown in FIG. 1J, a mounting surface S substantially perpendicular to the main light emitting surface M can be singulated. As described above, in the first embodiment, the electrically conductive member 3 is formed prior to forming the light shielding member 4. As described later below, the sequence of manufacturing steps can be changed, which will be described in detail in second to fourth embodiments. Now, each step in the first embodiment will be described in detail below with reference to accompanying drawings.

Arranging Light Emitting Element on Base Body

As shown in FIG. 1A and FIG. 1B, the first light emitting element 3 and the second light emitting element 2 each having the main light emitting surface M and the surface opposite to the main surface M and facing the pair of electrodes 2a, 2b are arranged adjacent to each other on the base body 1, with the pair of electrodes 2a, 2b facing upward. At least two light emitting elements 2; the first light emitting element 2 and the second light emitting element 2 are provided. The first light emitting element 2 and the second light emitting element 2 each includes a semiconductor layer that include at least a light emitting layer, and has the main light emitting surface M and the surface opposite to the main light emitting surface M and having a pair of positive and negative electrodes 2a, 2b. The light emitting elements 2 that are singulated from a wafer state can be screened, so that only the light emitting elements having desired light distribution characteristics can be arranged on the base body 1. Thus, the light emitting device can be formed with good yield.

The light emitting elements 2 can have a planar shape of any one of a circular shape, an elliptical shape, or a polygonal shape such as a triangular shape, a quadrangular shape, or a hexagonal shape. The light emitting element 2 can have appropriate size and thickness. In the first embodiment, for example, the light emitting elements 2 having planar shapes of quadrangular shapes can be used.

The base body 1 for arranging the light emitting elements 2 is provided. The base 1 can be removed prior to cutting the electrically conductive members and the light shielding member, or can be cut together with the electrically conductive members and the light shielding member to be used as a part of the light emitting device.

Next, the light emitting elements 2 are arranged on the base body 1. The first embodiment can be such that, two light emitting elements 2 are arranged as one set and at least one set of the light emitting elements 2 are arranged on the base body 1, and in a later step, at least one pair of electrically conductive members with respect to each set is formed so as not to protrude from the surfaces of the light emitting elements that are opposite the surfaces facing with each other. With this configuration, at the time of singulating the light emitting devices, the electrically conductive members are not exposed from an upper surface opposite the mounting surface. Thus, side-view type light emitting devices of smaller light absorption can be efficiently formed. The three or more light emitting elements may also be arranged as a set. An embodiment thereof will be described in detail in the fifth embodiment.

In the first embodiment, the two light emitting elements are arranged adjacent to each other on the base body 1 with the electrodes 2a, 2b of each of the light emitting elements 2 arranged upward, that is, the main light emitting surface M of each of the light emitting elements 2 is in contact with (in other words, facing) the base body 1. This configuration can facilitate forming of the electrically conductive members on the respective electrodes, and further, can facilitate forming of the light shielding member so as to expose the main light emitting surface M. The two light emitting elements 2 are preferably arranged so that the pair of electrodes 2a, 2b of the first light emitting element 2 and the pair of electrodes 2a, 2b of the second light emitting element 2 face each other. In other words, in the first embodiment, long-side lateral surfaces of the two light emitting elements 2 preferably face each other. This configuration can facilitate formation of the electrically conductive member with using a smaller amount of material in a later step, compared to the case where one of the electrodes of the first light emitting element 2 and one of the electrodes of the second light emitting element 2 face each other, in other words, short-side lateral surfaces of the two light emitting elements 2 face each other.

Further, the two light emitting elements 2 are preferably arranged so that different polarities of the two light emitting elements 2 are adjacent to each other. More specifically, as shown in FIG. 1A, the two light emitting element 2 are preferably arranged so that a positive electrode 2a of the first light emitting element 2 and a negative electrode 2b of the second light emitting element 2 face each other, and a negative electrode 2b of the first light emitting element 2 and a positive electrode 2a of the second light emitting element 2 face each other. This configuration allows aligning of the positive and the negative terminals (i.e., electrically conductive members respectively connected to the positive or negative electrodes) at the right-left locations. Further, the two light emitting elements 2 can be arranged so that the same polarities of the two light emitting elements 2 are adjacent to each other. This configuration allows arranging of the light emitting elements 2 in the same orientation without changing orientations, which facilitates arranging the light emitting elements 2 on the base body 1. Further, this configuration allows for forming of the light emitting devices in which the left-and right locations of the positive and negative terminals differ on the mounting surface.

The interval of the two light emitting elements 2 can be set as appropriate. The interval will affect the thickness of the light shielding member to be described later below. Accordingly, the size of the interval is preferably adjusted to form the light shielding member with a desired thickness. For example, although depends on the positional accuracy of the light emitting elements, positional accuracy of cutting in the later step of singulating, and a configuration of the light shielding member, the light emitting elements can be arranged at an interval of about 30 µm to about 300 µm. This configuration can facilitate forming of the electrically conductive member in the later step, and also allows for formation of the light shielding member that can sufficiently block light leaking from the portions other than the main light emitting surface. Further, the number of light emitting devices obtained from a wafer can be secured, so that the light emitting devices can be manufactured efficiently.

At the time of arranging the light emitting elements 2 on the base body 1, for example, an adhesive material can be arranged beforehand on the base body 1 and/or the light emitting elements 2, then, the light emitting elements 2 can be fixed on the base body 1 by the adhesive material. For the adhesive material, a known material in the art can be used. In particular, in the case of using the base body 1 as a part of the light emitting device, light-transmissive resin is preferably used. In the case of using the base body 1 having adhesiveness, the light emitting elements 2 can be fixed on the base body 1 by the adhesiveness of the base body 1. With this, the light emitting elements 2 can be arranged efficiently with a smaller number of steps.

Forming Electrically Conductive Member

In the first embodiment, next, as shown in FIG. 1C and FIG. 1D, a pair of electrically conductive members 3 (3a, 3b) is formed on the electrodes 2a, 2b of the first light emitting element 2 and extended on the electrodes 2a, 2b of the second light emitting element 2, respectively. That is, a pair of electrically conductive members 3 is formed so as to bridge over the two light emitting elements 2. In the first embodiment, the pair of electrically conductive members 3 can be formed over the two adjacent electrodes of different polarities of the two light emitting elements 2. More specifically, an electrically conductive member 3a disposed over the positive electrode 2a of the first light emitting element 2 and the negative electrode 2b of the second light emitting element 2, and an electrically conductive member 3b disposed over the negative electrode 2b of the first light emitting element 2 and the positive electrode 2a of the second light emitting element 2 can be formed.

The pair of electrically conductive members 3 is preferably formed between the first light emitting element 2 and the second light emitting element 2 so that lower portion of the electrically conductive members 3 are lower than planes of the upper surfaces of the electrodes 2a, 2b. This configuration can facilitate exposing of the electrically conductive members from the cut-surface (mounting surface of the light emitting device) created by cutting the pair of electrically conductive members 3 and the light shielding member that are between the pair of light emitting elements 2 in a later step. Also, in order to avoid short-circuiting in the light emitting device, the electrically conductive members 3 are preferably disposed so that the electrically conductive members 3 are not directly contacting the semiconductor layers. Accordingly, in the first embodiment, for example, the electrically conductive member 3 can be disposed between the light emitting elements 2 and in a region higher than a plane that includes the lower surfaces of the electrodes 2a, 2b so as to cover a portion of each of the lateral surfaces of the electrodes 2a, 2b. In this case, the electrodes 2a, 2b with an appropriately large thickness can facilitate the formation of the electrically conductive member 3 so as not to directly contact the semiconductor layers, respectively. For example, in the first embodiment 1, the electrodes 2a, 2b can be formed with a thickness of 10 µm or greater, preferably 50 µm or greater. With this, the electrically conductive members 3 can be prevented from contacting the semiconductor layers. Also, with this, sufficient areas of the electrically conductive members can be exposed on the mounting surface. The electrodes 2a, 2b of the light emitting elements 2 may have different thicknesses.

In the case where the surfaces of the light emitting elements 20 are covered by an insulating member and insulation is secured, the electrically conductive members 3 may be formed to a lower side than the plane including the lower surfaces of the electrodes 2a, 2b, for example, onto the lateral surfaces of the semiconductor layers. With this, the area of the electrically conductive members 3 exposed on the mounting surface of the light emitting device can be increased, so that light emitting devices having high heat dissipation performance and high mountability can be formed. However, each electrically conductive member 3 is preferably formed in a region higher than the plane including the main light emitting surface M of the light emitting element 2. That is, the electrically conductive members 3 are preferably formed not contacting the base body 1 between the light emitting elements 2. With this arrangement, absorption of light in the light emitting device due to the electrically conductive member 3 exposed on the same plane as the main light emitting surface M can be prevented.

The electrically conductive members 3 can be formed by employing, for example, electrically conductive paste or solder, and using a coating method such as potting, plotting, printing, or thermal spraying, and then applying heat to harden. With this, cost and time can be reduced compared to the case of forming the electrically conductive members by plating or the like. In particular, in the case of forming the electrically conductive members 3 prior to the light shielding member as in the first embodiment, a solder is preferably applied as the electrically conductive members 3. This can facilitate application of a desired amount of the electrically conductive members on desired locations, so that a pair of electrically conductive members 3a, 3b can be disposed easily over respective upper surfaces of a first pair of electrodes 2a, 2b and corresponding upper surfaces of a second pair of electrodes 2a, 2b. For the solder, AuSn that has a relatively high melting point can be preferably used so as to prevent remelting of the electrically conductive members 3 at the time of mounting the light emitting device on the mounting substrate.

As in the first embodiment, in the case where the electrically conductive members 3 are formed prior to the light shielding member 4, the viscosity of the electrically conductive members 3 is preferably adjusted in order to hold the electrically conductive members 3 in desired regions as described above. For example, for the electrically conductive members 3, AuSu paste having a viscosity in a range of about 50 Pa·s to about 500 Pa·s, preferably in a range of about 200 Pa·s to about 300 Pa·s can be applied on a desired region while adjusting amount as needed. As described above, with the use of the electrically conductive member 3 having adjusted viscosity, the electrically conductive members 3 can be maintained at desired positions, so that light emitting devices can be formed efficiently with a smaller number of steps.

Forming Light Shielding Member

In the first embodiment, next, as shown in FIG. 1E and FIG. 1F, a light shielding member 4 at least covering between the light emitting elements 2 is formed. More specifically, the light shielding member 4 that is provided to expose the main light emitting surfaces M is formed on the base body 1 and covering the two light emitting elements 2 and a pair of electrically conductive members 3. With this, the pair of electrically conductive members 3a, 3b of each of the light emitting elements 2 can be insulated, and further, release of light other than from the main light emitting surface M can be prevented.

At this time, as shown in FIG. 1F, the electrically conductive member 3 can be formed to be exposed at the upper surface of the light shielding member 4. For example, as shown in FIG. 1E, the light shielding member 4 is formed to cover the upper surface of the electrically conductive members 3, then, an upper portion of the light shielding member 4 is partially removed by cutting or polishing. Thus, the electrically conductive members 3 can be exposed. Alternatively, the electrically conductive members 3 can be exposed by removing upper portions of the light shielding member 4 and the electrically conductive members 3. The upper surface side of the articles during the manufacturing will be the back surface side of the light emitting devices. Thus, with the upper surfaces of the electrically conductive members 3 exposed as described above, the electrically conductive members 3 can also be exposed as terminals from the back surfaces of the light emitting devices. This can facilitate formation of the light emitting devices having high heat dissipation performance and high mountability.

The light shielding member 4 can be obtained such that a light shielding material or a light-absorbing material contained in a base material such as resin is molded by using a method such as a transfer-molding method, a compression-molding method, a screen-printing method, or a potting method, then hardened. In particular, a compression-molding method or a transfer molding method that allows secure formation of the light shielding member 4 between the light emitting elements 2 that are under the electrically conductive members 3 is preferably used. The light shielding member can be formed at once (inclusive of the case of removing a portion of the light shielding member that formed at once) as described above, or can be formed by plural of separate steps. The latter will be described in detail in the fourth embodiment.

Cutting Electrically Conductive Member

Next, in the first embodiment, as shown in FIG. 1G and FIG. 1H, the pair of electrically conductive members 3 and the light shielding member 4 that are located between the light emitting elements 2 are cut in a direction substantially perpendicular to the main light emitting surfaces M of the light emitting elements 2. Accordingly, a mounting surface S substantially perpendicular to the light emitting surface (main light emitting surface M) and exposing the pair of electrically conductive members 3 can be formed in each light emitting device 10. In the first embodiment, the light shielding member 4 may be further cut substantially in parallel to one or more lateral surfaces of the light emitting elements 2, as shown in FIG. 1H, to obtain individual light emitting devices 10.

The light emitting elements 2 arranged on the base body 1 may have appropriate shapes in a plan view as described above, but the use of same shape can facilitate cutting of the electrically conductive members 3 and/or the light shielding member 4 along the light emitting elements 2. In the first embodiment, two quadrangular light emitting elements 2 are arranged so that adjacent lateral surfaces are facing each other, which facilitates cutting of the electrically conductive members 3 and/or the light shielding member 4 along the corresponding lateral surfaces of the light emitting elements 2. Thus, the light emitting devices can be singulated efficiently.

Cutting can be performed by using a known cutting method in the art, for example, blade dicing using a blade 5, laser dicing, cutter scribing, or the like, can be employed.

With the singulation as described above, as shown in FIG. 1I, a side-view type light emitting devices 10 each having a mounting surface S substantially perpendicular to the main light emitting surface M at the time of mounting on the mounting substrate 6, can be formed. As in the first embodiment 1, a pair of electrically conductive members 3 can be formed bridging adjacent two light emitting elements 2, with arranging electrically conductive paste or eutectic alloy is formed bridging the two light emitting elements 2, which allows a reduction in the manufacturing time and cost. Further, in the step of forming light shielding member the upper surfaces of the electrically conductive members 3 exposed as described above, the electrically conductive members 3 can also be exposed as terminals from the back surfaces of the light emitting devices. Accordingly, the light emitting devices 10 that exhibit high heat dissipation performance and high mountability on the mounting substrates 6 can be formed. Moreover, after being mounted, the light emitting devices 10 can be hardly caused to fall backward when forward stress is applied to the light emitting devices 10. The area of each of the electrically conductive members exposed on the mounting surface may be determined so that sufficient bonding strength can be secured in mounting of the light emitting devices 10 on the mounting substrates respectively. For example, the electrically conductive members may be exposed on the mounting surfaces with an area of about 0.03 mm$^2$ or greater, respectively. Also, as large as the area of each of the electrically conductive members exposed on the mounting surface is preferable to a degree not cause short-circuit when the light emitting devices are mounted on the mounting substrates.

Other Steps

In addition to the steps described above, for example, forming a wavelength converting layer, forming a light-transmissive layer, and/or forming coating film on the terminals can be appropriately performed.

In the step of forming wavelength converting layer, a wavelength converting layer 7 to convert light emitted from the main light emitting surface M into light of a desired wavelength or range of wavelengths can be formed covering the main light emitting surface M. For the wavelength converting layer 7, a material having a base material made of resin or glass and containing a wavelength converting material such as a phosphor can be used. The wavelength converting layer 7 can be formed by using a suitable method such as spraying, printing, coating, pasting, or the like. As described above, a base body 1 made of light-transmissive resin containing a wavelength converting material may be used as the wavelength converting layer 7. Alternatively, a wavelength converting layer surrounded by a frame of light shielding member is formed beforehand and pasted on the main light emitting surface, which allows formation of light emitting device having relatively clear boundary between light-emitting portion and non-emitting portion in operation.

In the step of forming a light-transmissive layer, a light-transmissive layer 8 is formed on the light emitting surface (more specifically on the wavelength converting layer 7 or the main light emitting surface M). With the light-transmissive layer 8, the light emitting surface of the light emitting device can be protected. For the light-transmissive layer 8, light-transmissive resin or glass, or the like, can be used. Further, a filler material or the like can be contained in the light-transmissive layer 8 that allows an improvement in the light extracting and a decrease of tackiness. The light-transmissive layer 8 can be formed by using a suitable method such as spraying, printing, coating, pasting, or the like. The step of forming wavelength converting layer 7 and the step of forming a light-transmissive layer 8 are preferably performed before cutting the pair of electrically conductive members 3a, 3b (i.e., before singulating).

In the step of forming coating film for terminal, a coating film 9 for terminal to protect the pair of electrically conductive members 3a, 3b, i.e., the terminals of each of the light emitting devices 2, which are exposed on the mounting surface by cutting the pair of electrically conductive members 3a, 3 and the light shielding member 4 between the two light emitting elements 2. For the coating film for terminal 9, gold, silver, nickel, aluminum, rhodium, copper, an alloy of those, or the like, can be used. The coating film 9 of the terminal can be provided with a thickness in a range of 0.03 μm to 0.5 μm. With this, degradation of the electrically conductive members can be reduced. The coating film 9 of the terminal can be formed by plating or sputtering, for example. In particular, the coating film 9 for terminal can be efficiently formed in such a manner that a covering film is formed at once on the light shielding member 4 and the pair of electrically conductive members 3a, 3b on the mounting surface S by sputtering or the like, then, laser light is irradiated on the entire of the mounting surface to remove only a portion of the covering film formed on the light shielding member 4. Also, irradiating laser light on the mounting surface S roughens the mounting surface S, allowing for reduction in tackiness. In addition to dispose the coating film 9 for terminal on the electrically conductive members 3a, 3b exposed on the mounting surface S, the coating film 9 for terminal can be disposed also on the electrically conductive members in the case where the electrically conductive members 3a, 3b are exposed on a back surface U, one or more lateral surfaces, and/or the upper surface of the light emitting device.

Each constituent member will be described in detail below.

Light Emitting Element

For the light emitting elements 2, light emitting diodes, laser diodes, or the like, commonly used in the art can be used. Various semiconductors can be used. Examples thereof include nitride-based semiconductors ($In_XAl_YGa_{1-X-Y}N$, $0 \leq X, 0 \leq Y, X+Y \leq 1$), Group III-V compound semiconductors such as GaP and GaAs, and Group II-VI compound semiconductors such as ZnSe. The light emitting elements 2 may each have a substrate that is used for growing semiconductor layer. Examples of the substrate include insulating substrates such as sapphire; SiC, ZnO, Si, GaAs, diamond; and oxide substrates that lattice matches with nitride semiconductors such as lithium niobate and neodymium gallate. The substrates may be removed by using laser lift-off method, or the like.

Base Body

For the base body 1, resin, ceramics, glass, or the like that is formed in a sheet shape can be used. In particular, in view of heat resistant property, a sheet-shaped polyimide resin is preferably used. The planar shape, size, thickness and so on of the base body 1 can be appropriately adjusted according to the size and number of the light emitting elements 2 to be arranged. In particular, the base body 1 of a sheet shape with a substantially uniform thickness and a substantially flat surface is preferable because it permits stable arrangement of the light emitting elements 2.

In the case of using the base body 1 as a part of the light emitting device, the base body 1 preferably has a light-transmissive property that the transmittance of 60% or greater, 70% or greater, 80% or greater, or 90% or greater to the light emitted from the light emitting elements 2. In particular, in the case of using the base body 1 as a part of the light emitting device, resin is preferably used for the base body 1, and examples thereof include silicone resin, silicone modified resin, epoxy resin, epoxy modified resin, phenol resin, polycarbonate resin, acrylic resin, TPX resin, polynorbornene resin, and hybrid resin containing at least one of these resins. Among those, silicone resin or epoxy resin is preferred, and particularly, silicone resin that has good light resistance and heat resistance is preferred.

Further, in the case of using the base body 1 as a part of the light emitting device, a wavelength converting member to convert the wavelength of light from the light emitting elements 2 to a different wavelength, for example, a fluorescent material and/or a luminescent material may be contained in the base body 1. Thus, the base body 1 can be used as the wavelength converting layer of the light emitting device. For the phosphor and/or the luminescent material, one known in the art can be used. Examples thereof include phosphors such as yttrium-aluminum-garnet (YAG)-based phosphors activated by cerium, lutetium-aluminum-garnet (LAG)-based phosphors activated by cerium, nitrogen-containing calcium aluminosilicate ($CaO-Al_2O_3-SiO_2$)-based phosphors activated by europium and/or chromium, silicate (($Sr, Ba)_2SiO_4$)-based phosphors activated by europium, β-sialon phosphors, nitride-based phosphors such as CASN-based or SCASN-based phosphors, KSF-based phosphors ($K_2SiF_6$:Mn), and sulfide-based phosphors, and luminescent materials such as nanocrystals, and quantum dots. Examples of luminescent materials further include semiconductor materials such as a group II-VI semiconductor, a group III-V semiconductor, and a group IV-VI semiconductor, more specifically, highly dispersible nanosize particles such as CdSe, core-shell type $CdS_xSe_{1-x}$/ZnS, and GaP.

The base body 1 may contain a filler material (for example, a diffusion agent, a coloring agent, or the like). Examples of the filler material include silica, titanium oxide, zirconium oxide, magnesium oxide, glass, a crystal or sintered body of a phosphor, and a sintered body of a phosphor and an inorganic binding material.

Electrically Conductive Member

For the electrically conductive members 3, an electrically conductive paste or an eutectic alloy can be used. Specific examples thereof include tin-bismuth-based solder, tin-copper-based solder, tin-silver-based solder, gold-tin-based solder alloys having Au and Sn as main components, alloys having Au and Si as main components, alloys having Au and Ge as main components, eutectic alloys having Au and Si as main components, conductive pastes of silver, gold, palladium and the like, or materials of combination of those. As in the first embodiment, in the case where the electrically conductive members 3 are formed prior to the light shielding member 4, in other words, in the case of forming the electrically conductive members 3 so as to be held between the light emitting elements 2, AuSn-based solder is preferably used, as described above. As will be described in detail below in the second and further embodiments, in the case of forming the electrically conductive members 3 after forming the light shielding member 4, in other words, in the case of forming the electrically conductive members 3 in the respective recesses of the light shielding member 4 or in the case of disposing a pair of electrically conductive members 3 on the light shielding member 4 and bridging the two light shielding members, an electrically conductive paste that can be hardened at a relatively low temperature is preferably used. Accordingly, discoloration and/or degradation of the light shielding member can be reduced and the light extraction efficiency of the light emitting device can be maintained.

Light Shielding Member

The light shielding member 4 can be formed, for example, with a material in which a light-reflecting material or a light-absorbing material is contained in a base material made of resin, which can facilitate formation of the light shielding member 4 in a desired shape. Among them, the light shielding member 4 is preferably formed with a material in which a light-reflecting material is contained in a base material made of the resin. Examples of the resin include silicone resin, modified silicone resin, epoxy resin, modified epoxy resin, unsaturated polyester resin, polyimide resin, modified polyimide resin, phenol resin, urethane resin, acrylate resin, urea resin, acrylic resin, polyphthalamide resin (PPA), polyphenylene sulfide (PPS), and liquid crystal polymer (LCP). Those resins may be used singly or a combination of two or more. In particular, in view of heat resistant property and weather resistant property, the material of the light shielding member 4 preferably contains silicone-based resin. The light shielding member 4 may have a thickness in a range of about 10 μm to about 100 μm, which allows formation of a small light emitting device while sufficiently shielding light emitted from portions other than a main light-emitting surface of the light emitting elements.

Examples of light-reflecting materials or light-absorbing materials include ceramics, titanium dioxide, silicon dioxide, zirconium dioxide, potassium titanate, alumina, aluminum nitride, silicon nitride, boron nitride, mullite, niobium oxide, zinc oxide, barium sulfate, and various kinds of rare earth oxides (e.g. yttrium oxide and gadolinium oxide). The light-reflecting material or light-absorbing material is preferably contained about 20 by weight to about 80% by weight, more preferably contained about 30 by weight to about 70% by weight based on the total weight of the light shielding member. With this arrangement, the light-shielding property and strength of the light shielding member can be secured.

Second Embodiment

Figure 2A:
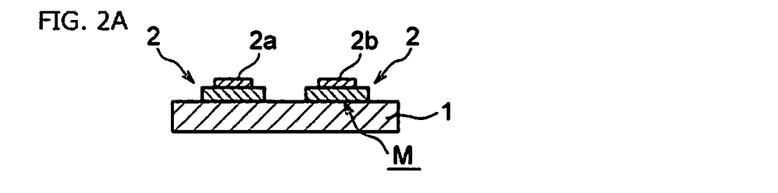
FIG. 2A is a schematic cross-sectional view illustrating a step of arranging light emitting elements on a base body according to a method of manufacturing a light emitting device according to a second embodiment.
Figure 2B:
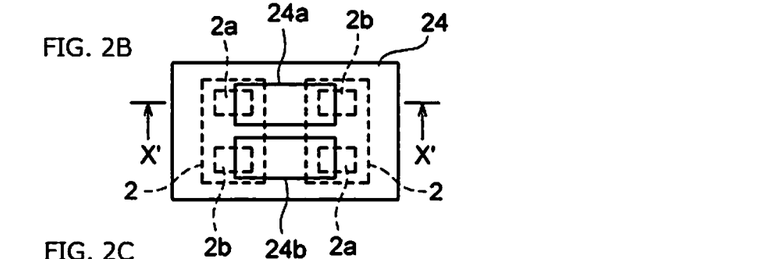
FIG. 2B is a schematic plan view illustrating a step of forming a light shielding member according to the second embodiment.
Figure 2C:
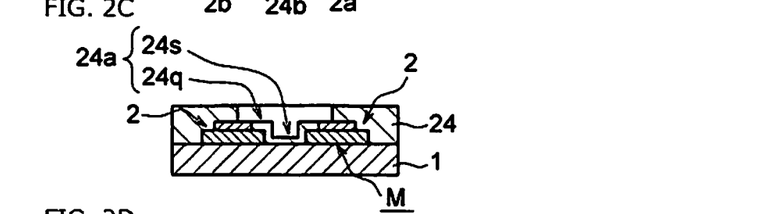
FIG. 2C is a schematic cross-sectional view taken along line X-X' of FIG. 2B.
Figure 2D:
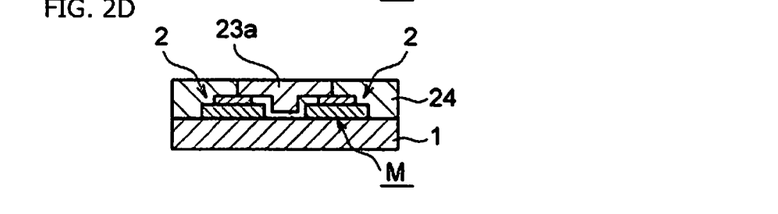
FIG. 2D is a schematic cross-sectional view illustrating a step of forming an electrically conductive member according to the second embodiment.
Figure 2E:
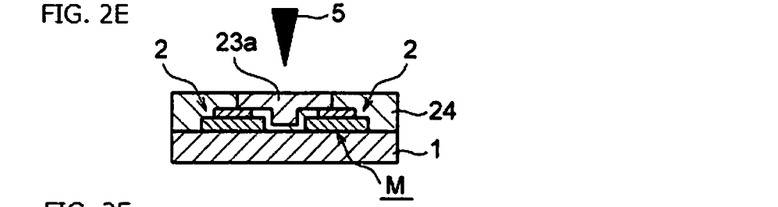
FIG. 2E and FIG. 2F are schematic cross-sectional views illustrating a step of cutting the electrically conductive member according to the second embodiment.
Figure 2F:
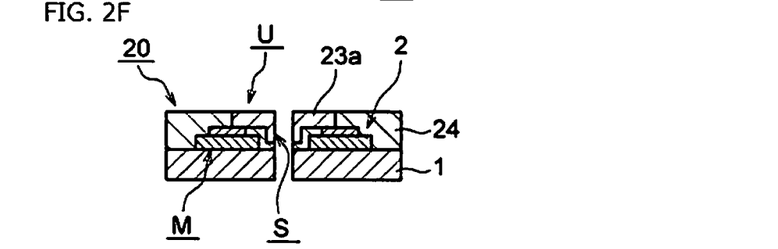

FIG. 2A is a schematic cross-sectional view illustrating a step of arranging light emitting elements on a base body according to a method of manufacturing a light emitting device according to a second embodiment. FIG. 2B is a schematic plan view illustrating a step of forming a light shielding member according to the second embodiment. FIG. 2C is a schematic cross-sectional view taken along line X-X' of FIG. 2B. FIG. 2D is a schematic cross-sectional view illustrating a step of forming an electrically conductive member according to the second embodiment. FIG. 2E and FIG. 2F are schematic cross-sectional views illustrating a step of cutting the electrically conductive member according to the second embodiment. In FIG. 2A to FIG. 2F, of the pair of electrically conductive members, one electrically conductive member 23a is illustrated. In the method of manufacturing according to the second embodiment, different from that in the first embodiment, a pair of light shielding members defining a pair of recesses at locations for forming electrically conductive members is formed prior to forming the electrically conductive members. This configuration can facilitate formation of the electrically conductive members in desired regions. More specifically, as shown in FIG. 2A, a first and a second, two light emitting elements 2 each having a main light emitting surface M and a surface opposite to the main light emitting surface M and having a pair of electrodes 2a, 2b are arranged adjacent to each other on the base body 1, with the pair of electrodes 2a, 2b facing upward. Then, as shown in FIG. 2B and FIG. 2C, a light shielding member 24 defining a pair of recesses 24a, 24b respectively corresponding to the electrodes 2a, 2b of the first light emitting element 2 to the electrodes 2a, 2b of the second light emitting element 2 is formed. In other words, a pair of recesses 24a, 24b is formed so that at least a portion of the electrodes 2a, 2b of each of the light emitting elements 2 forms a portion of the recess (i.e., exposed in the recess). Then, as shown in FIG. 2D, an electrically conductive member 23a is formed in each of the pair of recesses 24a. Next, as shown in FIG. 2E, the pair of electrically conductive members 23a and the light shielding member 24 are cut between two light emitting elements 2 in a direction s to the main light emitting surfaces M.

In the second embodiment, the light shielding member 24 defining recesses 24a, 24b can be formed by using a mold having protruding portions that can form desired recesses. The use of the mold can facilitate formation of the recesses 24a, 24b in desired regions, allowing the light shielding member 24 present between the recesses 24a, 24b and the lateral surfaces of the light emitting elements 2. Thus, the recesses 24a, 24b with depths reaching the semiconductor layers of the light emitting elements 2 are formed to allow an increase in the areas of the electrically conductive members 3a, 3b that are exposed on the mounting surface of the light emitting device. Accordingly, heat dissipation and mountability can be secured, while reducing occurrence of short circuit and absorption of light, thus, a light emitting device of high reliability can be obtained.

The bottom surfaces of the pair of recesses 24a, 24b are preferably located at depths so that at least the upper surfaces of the electrodes 2a, 2b are exposed. In particular, the bottom surfaces of the recesses between the light emitting elements 2 are preferably lower than the upper surfaces of the electrodes 2a, 2b. With this arrangement, the areas of the electrically conductive members 3a, 3b that are exposed on the mounting surface can be increased. The bottom surfaces of the recesses 24a, 24b between the light emitting elements 2 is preferably higher than the main emitting surfaces M of the light emitting elements 2. With this arrangement, the electrically conductive members can be formed so as not to be exposed in the same plane as the main light emitting surfaces M, so that formation of the light emitting device in which absorption of light can be reduced.

In the second embodiment, as shown in FIG. 2C, recesses 24a each formed with a bottom surface having portions of different depths can be formed. That is, in the second embodiment, the bottom surface of each of the recesses 24a, 24b is formed with a first depth where portions of the upper surfaces of the pair of electrodes 2a, 2b are exposed (hereinafter may be referred to as "shallow recess(es) 24q") and at locations between the light emitting elements, with a second depth deeper than the main light emitting surface M (hereinafter may be referred to as "deep recesses 24s". That is, recesses with stepped bottom surfaces can be formed. With the recess 24a, 24b as described above, the pair of electrodes can be disposed bridging between the two adjacent light emitting elements while, with the deep recesses 24s, securing large area of the electrically conductive members that are exposed on the mounting surface S of the light emitting device. The shallow recesses 24q may have a depth in a range of about 30 μm to about 100 μm, for example. With this arrangement, at the time of disposing the electrically conductive members in the recesses, overflowing of the electrically conductive members can be largely reduced. The deep recessed 24s (further recessed portions of the recesses) may be formed with depths in a range of, for example, about 30 μm to about 100 μm. Thus, sufficient areas of the electrically conductive members can be exposed on the mounting surface of the light emitting device.

The forming region of the recesses 24a, 24b is preferably arranged as below. Each of the recesses 24a, 24b are preferably formed in the arranging direction of the light emitting elements 2, corresponding to a region between the two light emitting elements and inclusive of facing lateral surfaces of the electrodes and between the light emitting elements, more preferably corresponding to a region between the two light emitting elements and inclusive of portions of the upper surfaces of the electrodes. This arrangement allows for securing the contact area between the electrically conductive members and corresponding electrodes 2a, 2b, which facilitates formation of the light emitting device of good heat dissipation. The deep recesses 24s between the light emitting elements 2 are preferably formed so that in the arranging direction, lateral surfaces of the light emitting elements 2 that are adjacent to each other are not to be exposed. This arrangement allows for disposing of the light shielding member 24 between the electrically conductive members 23 and the light emitting elements 2, so that occurrence of short circuit can be reduced and also facilitating formation of the light emitting device in which absorption of light can be largely reduced. Further, the recesses 24a, 24b are preferably formed spaced apart from each other as shown in FIG. 2B. For example, the recesses are preferably formed spaced apart from each other by a distance in a range of 100 μm to 150 μm. With this arrangement, the pair of electrically conductive members disposed in the pair of recesses 24a, 24b can be insulated from each other. Further, the recesses 24a, 24b may be formed extended to locations corresponding to cutting surfaces substantially in parallel to the lateral surfaces of the light emitting elements 2, in singulating that is to be performed in a later step of the manufacturing, the lateral surfaces of the light emitting devices locations outside of the light emitting device Accordingly, the electrically conductive members can be exposed from the lateral surfaces of the light emitting device, so that bonding strength between the light emitting device and the mounting substrate can be enhanced. The recesses 24a, 24b are preferably formed so that of the cut surfaces substantially in parallel to the lateral surfaces of the light emitting elements 2, that to be cut in singulating, at locations inward of the surfaces that to be the upper surface of the light emitting device. With this arrangement, the light emitting device having a large reduction in absorption of light by an adhesive agent used at the time of mounting on the mounting substrate can be formed.

The recesses 24a, 24b can be formed ether with different depth within a recess or with approximately same depth. For example, a pair of recesses with a depth reaching the upper surfaces of the electrodes can be formed. With this, a necessity of mold of complicated shape can be avoided which can reduce the cost in manufacturing. The recesses 24a, 24b may be formed to of the cut surfaces of lateral surfaces of the light emitting elements to be cut later in manufacturing, an outside of the surface that to be the upper surface of the light emitting device so that the electrically conductive members are also exposed on the upper surface of the light emitting device. An embodiment thereof will be described in detail in the fifth embodiment.

As shown in FIG. 2B, the recesses 24a, 24b where the electrically conductive members are to be disposed can be formed in a quadrangular shape in a plan view. The recesses 24a, 24b where the electrically conductive members to be disposed can also be formed with a larger width between the light emitting element in a plan view. For example, the recesses 24a, 24b may be formed in a circular shape, an elliptical shape, a hexagonal shape in a plan view. In this case, in a later step in the manufacturing, the wider width portion of the electrically conductive members and the light shielding member that are between the pair of light emitting elements can be cut substantially perpendicular to the main light emitting surfaces, so that the light emitting devices each having electrically conductive members with increasing width toward the mounting surface can be formed. With this arrangement, heat dissipation performance of the light emitting devices can be improved. The recesses of relatively complicated shapes in a plan view as described above can be formed easily by the used of mold as in the second embodiment.

In the second embodiment, the electrically conductive members 23 are disposed in the recesses 24a, 24b, respectively, which allows for wide selection as to the materials, viscosity, and methods of forming of the electrically conductive members 23. In particular, the electrically conductive members 23 are preferably formed with the use of an electrically conductive paste such as Ag paste and using a potting method. Electrically conductive paste such as Ag paste has relatively low melting point compared to that of solder or the like, so that in a case where the light shielding member is disposed prior to the electrically conductive member, as in the second embodiment, discoloration and/or degradation of the light shielding member can be largely decreased while disposing the electrically conductive member 23. Also, disposing the electrically conductive members 23 by potting can facilitate step-by-step supply of the electrically conductive members 23 to the deep recesses 24a to the shallow recesses 24q, so that the electrically conductive member 23 can be filled in the recesses substantially without leaving a gap. In the case of using a printing method, the electrically conductive members 23 can be disposed efficiently in the densely formed recesses.

In the second embodiment, as shown in FIG. 2F, the pair of electrically conductive members 23a can be exposed on the mounting surface S and the back surface U (that is at the upper surface side in manufacturing). Thus, heat dissipation and mountability of the light emitting device 20 can be improved. Further a light shielding member may be disposed on the back surface U to interpose the pair of electrically conductive members, and cutting is performed through the interposed electrically conductive members to obtain the light emitting device. With this, singulating can be performed while protecting the pair of electrically conductive members to obtain individual light emitting devices 20. Steps in manufacturing other than that described above can be performed substantially as in the first embodiment, so that detailed description of those steps will be appropriately omitted.

The pair of recesses may be formed corresponding to a protruding shape of a mold, or may be formed, for example, disposing a light shielding member to cover the light emitting element 2 and removing a portion of the light shielding member. The latter mode will be described in detail in a third embodiment.

Third Embodiment

Figure 3A:
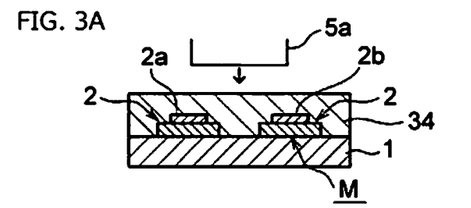
FIG. 3A to FIG. 3D are schematic cross-sectional views illustrating a step of forming a recess in a light shielding member according to a method of manufacturing a light emitting device according to a third embodiment.
Figure 3B:
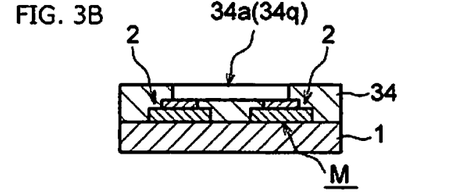
Figure 3C:
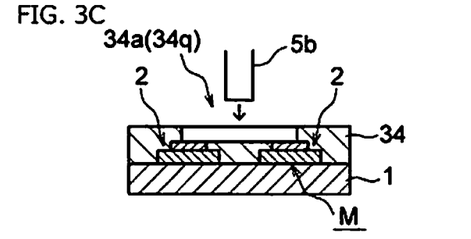
Figure 3D:
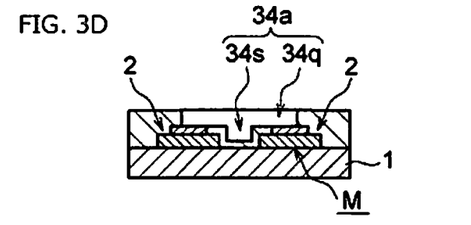
Figure 3E:
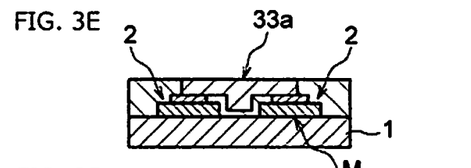
FIG. 3E is a schematic cross-sectional view illustrating a step of forming an electrically conductive member according to the third embodiment.
Figure 3F:
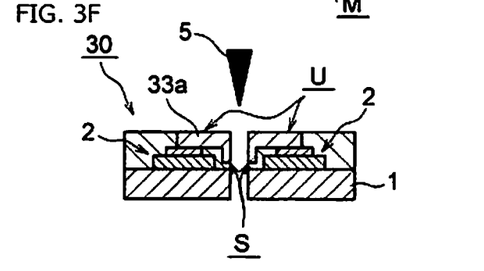
FIG. 3F is a schematic cross-sectional view illustrating a step of cutting the electrically conductive member according to the third embodiment.

FIG. 3A to FIG. 3D are schematic cross-sectional views illustrating a step of forming a recess in a light shielding member according to a method of manufacturing a light emitting device according to a third embodiment. FIG. 3E is a schematic cross-sectional view illustrating a step of forming an electrically conductive member according to the third embodiment. FIG. 3F is a schematic cross-sectional view illustrating a step of cutting the electrically conductive member according to the third embodiment. The method of manufacturing a light emitting device 30 according to the third embodiment differs from that in the second embodiment in forming a pair of recesses in a light shielding member. In FIG. 3A to FIG. 3F, of the pair of recesses, one recess 34a is illustrated. Also, of the pair of electrically conductive members, one electrically conductive member 23a is illustrated. In the third embodiment, as in the first and the second embodiments, two light emitting elements 2 are arranged adjacent to each other on the base body 1. The, as shown in FIG. 3A, a light shielding member 34 at least covering between the light emitting elements 2 is formed as one piece. Then, as shown in FIG. 3B, removing a portion of the light shielding member 34 by using an appropriate known method such as half-dicing, etching with the use of a mask, or the like, to form the recesses 34a. In particular, in view of versatility and processing accuracy, the recesses 34a are preferably formed by half-dicing.

More specifically, the light shielding member is disposed to embed two light emitting elements 2 arranged on the base body 1 and to a position higher than the upper surfaces of the pair of electrodes 2a, 2b, by using transfer molding, compression molding, screen printing, potting, or the like. Then, using a blade having a shape and a size that allows for forming of a recess of a desired shape, half-dicing is carried out to continuously remove portions of the light shielding member that cover a portion of the upper surface of each of the electrodes of adjacent light emitting elements for allowing the electrically conductive member to bridge the portions of the electrode and a portion of the light shielding member between the portions of the electrodes. Alternatively, half-dicing is carried out to continuously remove portions of the light shielding member that cover a portion of the upper surface of each of the electrodes of adjacent light emitting elements for allowing the electrically conductive member to bridge the portions of the electrodes, and a portion of the electrodes, and a portion of the light shielding member between the portions of the electrodes. Half dicing is preferably carried out to remove such portion(s) within a range higher than the lower surfaces of the electrodes 2a, 2b of the light emitting elements 2. Accordingly, portions of the light shielding member and portions of the electrodes can be removed without damaging the light emitting elements 2 to form the recess 34a.

Also, alternatively, using blades having different width and in a similar manner as described above, a recess 34a that includes a shallow recess 34q and a deep recess 34s may be formed. For example, as shown in FIG. 3A and FIG. 3B, with the use of a wide blade 5a, the shallow recess 34q with a width in a range of exposing at least a portion of the upper surface of each of the electrodes 2a, 2b and with a depth in a range of a thickness (distance between the upper surface and the lower surface of each of the electrodes 2a, 2b can be formed. Also, as shown in FIG. 3C and FIG. 3D, with the use of a narrow blade 5b, between adjacent two light emitting elements 2, the deep recess 34s with a width in a range not to exposing proximal lateral surfaces of the light emitting elements 2 and with a depth in a range between a plane of the bottom surface of the shallow recess 24q and a plane above the main light emitting surface M can be formed. The forming sequence of the shallow recess 34q and the deep recess 34s can be appropriately selected, and the deep recess 34s may be formed prior to the deep recess 34s.

Steps in manufacturing other than that described above can be performed substantially as in the second embodiment, so that detailed description of those steps will be appropriately omitted. More specifically, as shown in FIG. 3E, the electrically conductive member 34a is formed and as shown in FIG. 3F, individual light emitting devices 30 are singulated. As described above, the light emitting device may be formed such that the light shielding member is further disposed on the upper surfaces of the electrically conductive member and the light shielding member (the back surface U of the light emitting device), and cutting is performed through the interposed electrically conductive members to obtain the light emitting device. With this, singulating can be performed while protecting the pair of electrically conductive members to obtain individual light emitting devices.

As described above, according to a method of manufacturing a light emitting device of the third embodiment, the light shielding member 34 with desired recesses can be formed easily without a need of a mold of complicated shape. Thus, the electrically conductive members can be formed with accuracy in a desired region while realizing a reduction in the manufacturing cost.

Fourth Embodiment

Figure 4A:
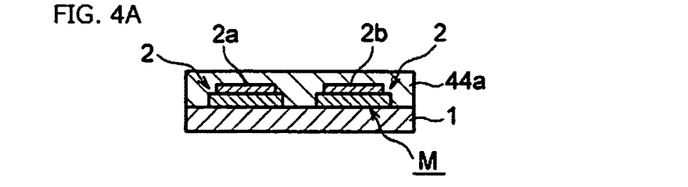
FIG. 4A and FIG. 4B are schematic cross-sectional views illustrating a step of forming a first light shielding member according to a method of manufacturing a light emitting device according to a fourth embodiment.
Figure 4B:
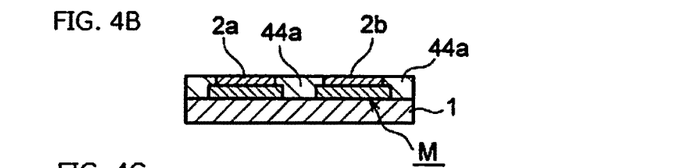
Figure 4C:
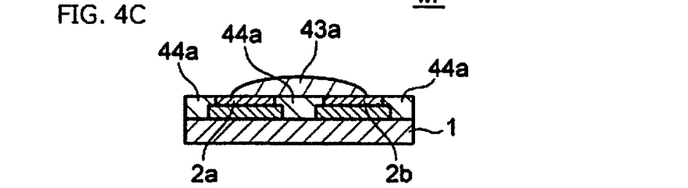
FIG. 4C is a schematic cross-sectional view illustrating a step of forming an electrically conductive member according to the fourth embodiment.
Figure 4D:
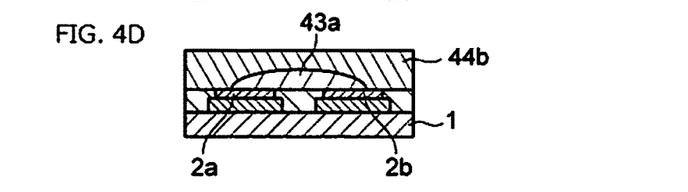
FIG. 4D and FIG. 4E are schematic cross-sectional views illustrating a step of forming a second light shielding member according to the fourth embodiment.
Figure 4E:
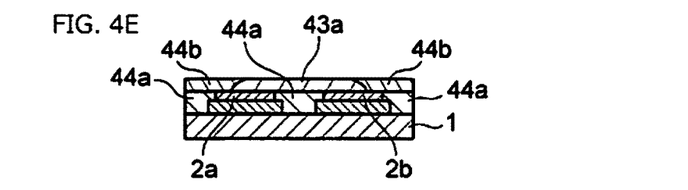
Figure 4F:
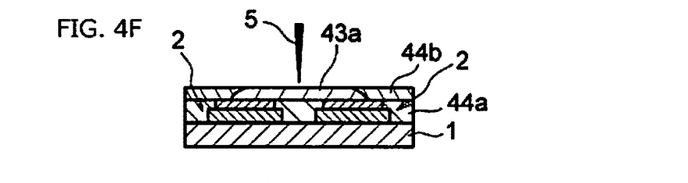
FIG. 4F and FIG. 4G are schematic cross-sectional views illustrating a step of cutting the electrically conductive member according to the fourth embodiment.
Figure 4G:
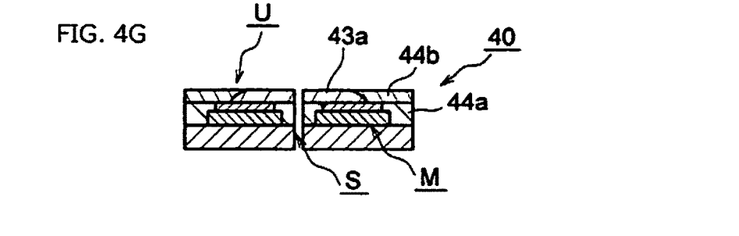

FIG. 4A and FIG. 4B are schematic cross-sectional views illustrating a step of forming a first light shielding member according to a method of manufacturing a light emitting device according to a fourth embodiment. FIG. 4C is a schematic cross-sectional view illustrating a step of forming an electrically conductive member according to the fourth embodiment. FIG. 2C is a schematic cross-sectional view taken along line X-X' of FIG. 2B. FIG. 4D and FIG. 4E are schematic cross-sectional views illustrating a step of forming a second light shielding member according to the fourth embodiment. FIG. 4F and FIG. 4G are schematic cross-sectional views illustrating a step of cutting the electrically conductive member according to the fourth embodiment. In FIG. 4A to FIG. 4G, the electrically conductive member 43a that is one of the pair of electrically conductive members is illustrated. The method of manufacturing a light emitting device according to the fourth embodiment differs from that of the first to third embodiments in which the light shielding member is formed through plural steps. In the fourth embodiment, as shown in FIG. 4B, two light emitting elements 2 each having a main light emitting surface M and a surface opposite to the main surface M and having a pair of electrodes 2a, 2b are arranged adjacent to each other on the base body 4, with the pair of electrodes 2a, 2b facing upward. Next, a first light shielding member 44a is formed to cover at least between the light emitting elements 2 and to expose upper surfaces of the pair of electrodes 2a, 2b. The first light shielding member 44a can be formed such that, for example, as shown in FIG. 4A, forming a light shielding member covering both the two light emitting elements 2 arranged on the base body 1, then removing a portion of the light shielding member (and the electrically conductive member) by cutting or polishing to expose a pair of electrodes 2a, 2b. Then, as shown in FIG. 4C, a pair of electrically conductive members 43 (43a, 43b) are formed on the electrodes 2a, 2b of the first light emitting element 2 and extended on the electrodes 2b, 2a of the second light emitting element 2, respectively. At this time, each of the electrically conductive members 43 (43a, 43b) is formed on each of the electrodes of the first light emitting element 2, and continuously on the first light shielding member 44a, 44b between the light emitting elements 2, and onto each of the corresponding electrodes of the second light emitting element 2. Next, as shown in FIG. 4E, a second light shielding member 44b is formed to cover the pair of electrically conductive members 43 (43a, 43b) and the first light shielding member 44a. In more detail, a second light shielding member 44b at least covering lateral surfaces of the electrically conductive members 43 (43a, 43b) is formed on the upper surfaces of the first light shielding member 44a and the electrodes 2a, 2b. The second light shielding member 44b can also be formed such that, for example as shown in FIG. 4D, forming a light shielding member to a position higher than the upper surface of the electrically conductive members 43 (43a, 43b) and by cutting or polishing, removing a portion of the light shielding member so as to expose the upper surfaces of the electrically conductive members 43 (43a, 43b). Thus, the pair of electrically conductive members 43 (43a, 43b) can be exposed on the back surface U of the light emitting device 40. Then, at least the first light shielding member 44a and the pair of electrically conductive members 43 that are located between the light emitting elements 2 are cut substantially perpendicular to the main light emitting surfaces M to singulate the light emitting devices 40. With the upper surfaces of the electrically conductive members 43 (43a, 43b) by the second light shielding member 44b, the pair of electrically conductive members 43 (43a, 43b) interposed between the first light shielding member 44a and the second light shielding member 44b can be cut substantially perpendicular to the main light emitting surfaces M at a location between the light emitting elements. Accordingly, singulating can be performed while protecting the pair of electrically conductive members to obtain individual light emitting devices 40. Steps in manufacturing other than that described above can be performed substantially as in the first embodiment, so that detailed description of those steps will be appropriately omitted.

According to the method of manufacturing a light emitting device as described above, a pair of electrically conductive members can be easily formed in a desired region without a need of a mold of complicated shape or requirement of high working accuracy.

Figure 5:
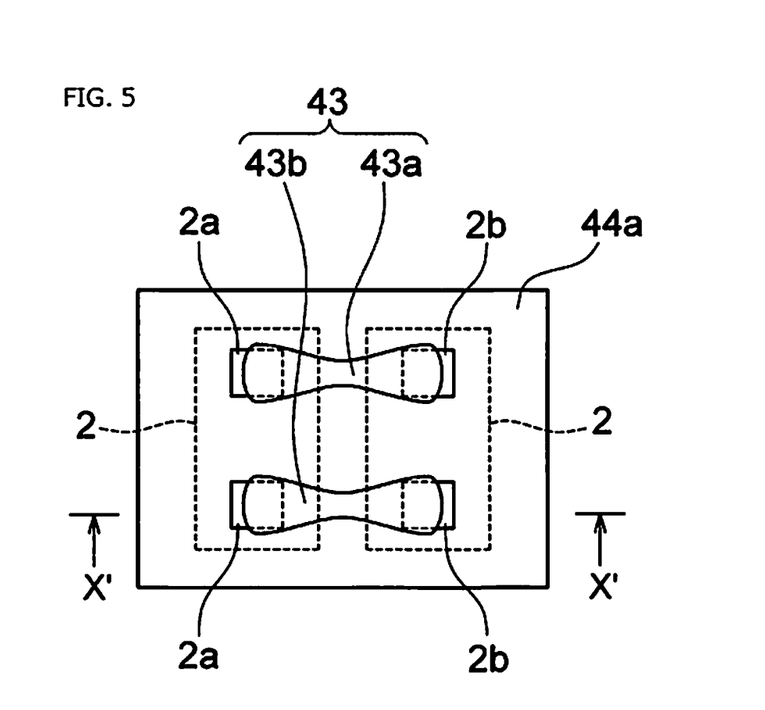
FIG. 5 is a schematic plan view of FIG. 4C.

FIG. 5 is a schematic plan view of FIG. 4C. In a fourth embodiment, electrically conductive members 43 (43a, 43b) such as solder are disposed continuously on the first light shielding member 44a between the electrodes 2a, 2b and the light emitting elements 2, so that the electrically conductive members 43 (43a, 43b) made of a metal respectively bridge the corresponding electrodes 2a, 2b of the light emitting elements 2. Surfaces of the first light shielding member 44a with resin as a base material has less wettability than that of a metal, to the electrically conductive members 43 (43a, 43b) made of solder or the like, so that it is preferable to also form the electrically conductive members 43 continuously on the first light shielding member 44a by using an electrically conductive paste through mask printing. In the fourth embodiment, as shown in FIG. 5, the width of the electrically conductive members 43a, 43b on the first light shielding member 44a may be narrower than the width of the electrically conductive members 43a, 43b on the electrodes 2a, 2b. With this configuration, a sufficient interval between the electrically conductive members 43a, 43b on the mounting surface S can be secured, so that occurrence of short circuit in the light emitting device 40 can be prevented.

Fifth Embodiment

Figure 6A:
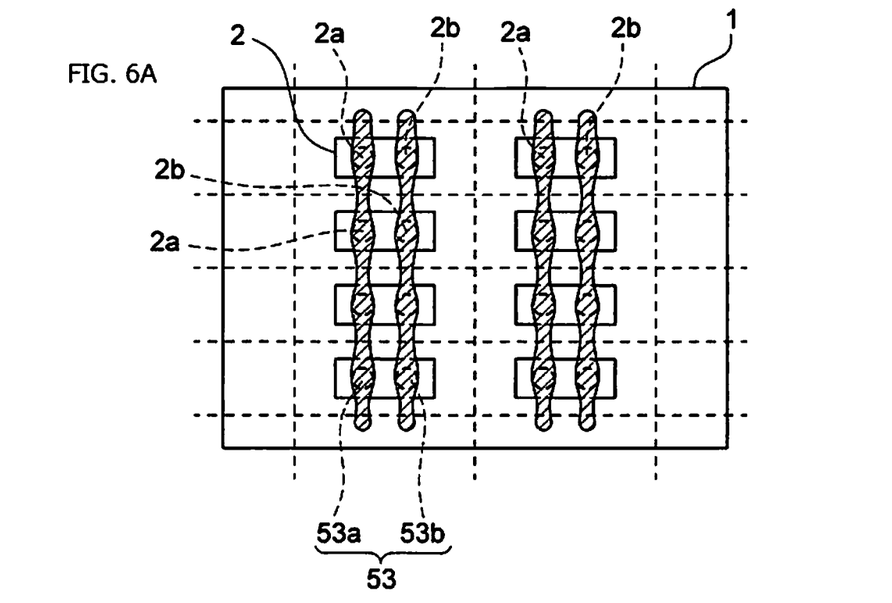
FIG. 6A and FIG. 6B are schematic plan views illustrating a step of forming an electrically conductive member according to a method of manufacturing a light emitting device according to a fifth embodiment.
Figure 6B:
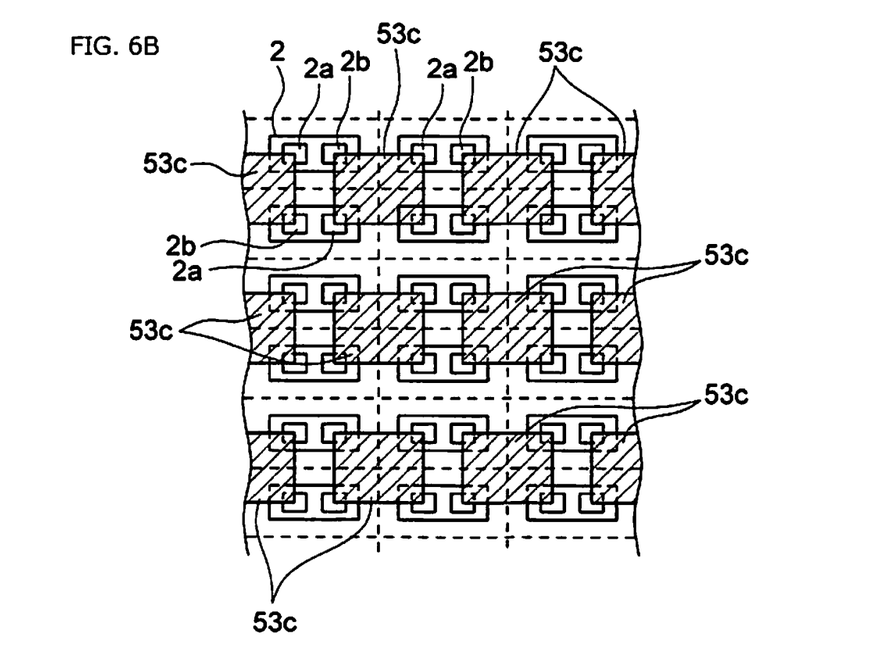

FIG. 6A and FIG. 6B are schematic plan views illustrating a step of forming an electrically conductive member according to a method of manufacturing a light emitting device according to a fifth embodiment. The fifth embodiment differs from the embodiments 1 to 4 in which three or more light emitting elements 2 are made one set, and a pair of electrically conductive members 53 (53a, 53b) each bridging the corresponding electrodes of the light emitting elements 2 are formed.

For example, as shown in FIG. 6A, three or more light emitting elements 2 (four in FIG. 6A) are made one set and arranged in a column direction on a base body 1 with the respective electrodes 2a, 2b facing upward. Then, a pair of electrically conductive members 53 (53a, 53b) are formed continuously on the corresponding electrodes of adjacent light emitting elements 2. Then, a light shielding member covering the electrically conductive members 53 and the light emitting elements 2 is formed, and at least the pair of electrically conductive members 53 and the light shielding member between the light emitting elements 2 are cut substantially perpendicular to the main light emitting surfaces M. Thus, individual light emitting devices of side-view type with a pair of electrically conductive members 53 exposed on the mounting surface S can be obtained. In the fifth embodiment, for example, with cutting at locations indicated by broken lines in FIG. 6A, the pair of electrically conductive members can be exposed also on the upper surface that is opposite to the mounting surface S. Thus, light emitting devices each having selectable mounting surface of either the upper surface or the lower surface can be formed. In this case, of the upper surface and the lower surface of the light emitting device, either surface having the same left-and-right orientation of the positive and negative terminals with respect to the main light emitting surface can be used as the main light emitting surface. Thus, at the time of arranging two light emitting elements 2 on the base body 1, the light emitting elements can be placed so that the electrodes a same polarity are arranged adjacent to each other (in other words, facing each other)

Also, as shown in FIG. 6B, for example, of a first and second two adjacent rows (or columns) of light emitting elements 2, a pair of electrodes of light emitting elements 2 of the first row (or column) and a pair of electrodes of light emitting elements 2 of the first row (or column) are facing with each other, and an electrically conductive member 53c is disposed as a piece on a portion four electrodes, that is, a portion of one of the pair of electrodes of each of the two light emitting elements 2 of adjacent rows and columns that are facing each other. Then, with cutting the electrically conductive members 53c and the light shielding member between the light emitting elements 2 are cut (at location shown by broken lines) in a direction substantially perpendicular to the main light emitting surfaces, the light emitting devices in which the electrically conductive members are exposed on the mounting surface and lateral surface can be formed. This can facilitate formation of the light emitting devices having high heat dissipation performance and high mountability.

In the fifth embodiment, an exemplary embodiment in which the electrically conductive members 53a, 53b, 53c are formed prior to the light shielding member, but the light shielding member formed with a pair of recesses extending over three or more electrodes of each of three or greater light emitting elements 2 and an electrically conductive member may be formed in the recess. Accordingly, the electrically conductive members can be formed easily with accuracy in a desired region on each electrode of each light emitting element.

The light emitting device according to the present invention can be used for various kinds of light sources, such as illumination light sources, light sources for various kinds of indicators, light sources for automobile use, light sources for displays, back light sources for liquid crystal displays, light sources for sensors, signals, automobile use, channel control characters for channel boards.

What is claimed is:

1. A method of manufacturing a light emitting device comprising:
    arranging a first light emitting element and a second light emitting element, each having a pair of electrodes disposed on a surface opposite to a main light emitting surface, on a base body adjacent to each other with the pair of electrodes facing upward;
    forming a first light shielding member at least covering between the first light emitting element and the second light emitting element;
    forming a pair of electrically conductive members each extending between one of the pair of electrodes of the first light emitting element and a corresponding one of the pair of electrodes of the second light emitting element;
    forming a second light shielding member at least covering the pair of electrically conductive members; and
    cutting the pair of electrically conductive members and the first and second light shielding members between the first light emitting element and the second light emitting element, along a direction substantially perpendicular to the main light emitting surface of each of the first light emitting element and the second light emitting element.

2. The method of manufacturing a light emitting device according to claim 1, wherein
    the pair of electrically conductive members is made of an electrically conductive paste or a eutectic alloy.

3. The method of manufacturing a light emitting device according to claim 1, wherein the forming of the first light shielding member further includes forming a pair of recesses on the first light shielding member to extend between one of the pair of electrodes of the first light emitting element and the corresponding one of the pair of electrodes of the second light emitting element.

4. The method of manufacturing a light emitting device according to claim 3, wherein
    the pair of recesses is formed by using a mold.

5. The method of manufacturing a light emitting device according to claim 3, wherein the forming of the pair of recesses includes removing portions of the first light shielding member after the forming of the first light shielding member covering the first light emitting element and the second light emitting element.

6. The method of manufacturing a light emitting device according to claim 3, wherein
    the forming of the pair of recesses includes forming each of the pair of recesses in a region between the first light emitting element and the second light emitting element lower than upper surfaces of the pair of electrodes and higher than the main light emitting surface of each of the first light emitting element and the second light emitting element.

7. The method of manufacturing a light emitting device according to claim 1, wherein the forming of the second light shielding member includes covering the first light emitting element, the second light emitting element and the pair of electrically conductive members by the second light shielding member, after the forming of the pair of electrically conductive members.

8. The method of manufacturing a light emitting device according to claim 1, wherein the forming of the pair of electrically conductive members includes forming each of the pair of electrically conductive members between the first light emitting element and the second light emitting element at a location lower than upper surfaces of the pair of electrodes and higher than the main light emitting surface of each of the first light emitting element and the second light emitting element.

9. The method of manufacturing a light emitting device according to claim 1, wherein
    the arranging of the first light emitting element and the second light emitting element includes arranging the first light emitting element and the second light emitting element so that different polarities of the first light emitting element and the second light emitting element are adjacent to each other.

10. The method of manufacturing a light emitting device according to claim 1, wherein the forming of the first light shielding member includes forming the first light shielding member to expose upper surfaces of the pair of electrodes, before the forming of the pair of electrically conductive members, and
    the forming of the second light shielding member includes forming the second light shielding member to cover the pair of electrically conductive members and the first light shielding member, after the forming of the pair of electrically conductive members.

11. The method of manufacturing a light emitting device according to claim 1, wherein the cutting of the pair of electrically conductive members and the first and second light shielding members includes cutting the pair of electrically conductive members and the first and second light shielding members so that a cut surface defines a mounting surface of the light emitting device and a surface of the light emitting device at a main light emitting surface side of a corresponding one of the first light emitting element and the second light emitting element that is substantially perpendicular to the mounting surface defines a light emitting surface of the light emitting device.

12. The method of manufacturing a light emitting device according to claim 1, wherein the forming of the first light shielding member includes covering an upper surface of the base body by the first light shielding member.

13. The method of manufacturing a light emitting device according to claim 1, further comprising providing the base body having light-transmissive property and containing a wavelength converting member that converts wavelength of light from the first light emitting element and the second light emitting element, wherein the cutting of the pair of electrically conductive members and the first and second light shielding members further includes cutting the base body together with the pair of electrically conductive members and the first and second light shielding members at a location between the first light emitting element and the second light emitting element.

14. The method of manufacturing a light emitting device according to claim 1, wherein the cutting of the pair of electrically conductive members and the first and second light shielding members further includes further cutting at least one of the first and second light shielding members substantially in parallel to one or more lateral surfaces of a corresponding one of the first light emitting element and the second light emitting element to singulate the light emitting device.

* * * * *